(12) United States Patent
Keig

(10) Patent No.: US 11,874,338 B2
(45) Date of Patent: Jan. 16, 2024

(54) MOTORLESS POWER ELECTRONIC TEST DEVICE

(71) Applicant: 741 Solutions LLC, Houston, TX (US)

(72) Inventor: James N. Keig, Houston, TX (US)

(73) Assignee: 741 SOLUTIONS LLC, Houston, TX (US)

( * ) Notice: Subject to any disclaimer, the term of this patent is extended or adjusted under 35 U.S.C. 154(b) by 0 days.

(21) Appl. No.: 18/194,153

(22) Filed: Mar. 31, 2023

(65) Prior Publication Data

US 2023/0314531 A1 Oct. 5, 2023

Related U.S. Application Data

(60) Provisional application No. 63/325,670, filed on Mar. 31, 2022.

(51) Int. Cl.
*G01R 31/40* (2020.01)
*G01R 19/165* (2006.01)

(52) U.S. Cl.
CPC ....... *G01R 31/40* (2013.01); *G01R 19/16547* (2013.01)

(58) Field of Classification Search
CPC combination set(s) only.
See application file for complete search history.

(56) References Cited

U.S. PATENT DOCUMENTS 8,373,406 B2 * 2/2013 Ahmed .............. G01R 31/2839
324/119
2013/0134985 A1 * 5/2013 Bernardon .............. G01R 31/52
324/527

FOREIGN PATENT DOCUMENTS

CN 107728061 A * 2/2018
CN 207368905 U * 5/2018
JP 2004194408 A * 7/2004 .............. H02J 9/061

* cited by examiner

*Primary Examiner* — Bickey Dhakal
(74) *Attorney, Agent, or Firm* — MEHRMAN LAW OFFICE; Michael J. Mehrman

(57) ABSTRACT

A "motorless" power electronic test device for testing adjustable speed motor drives without having to connect motors to the drive includes a bidirectional internal power converter, filtering, a charging switch for charging the capacitors of internal and external power converters, line switches for setting the test mode and operating the device, and a switch controller. The test device can be set to separately test an external power converter or an external rectifier, with the internal power converter operating in an AC-to-DC mode for testing the external power converter, and operating in a DC-to-AC mode for testing the external rectifier. The motorless test device recycles test power to reduce testing losses and carbon footprint. It is also much lighter and more convenient to handle than a full-load motor-absorber and, therefore, more amenable to deployment as a portable unit that can be readily transported to customer sites.

20 Claims, 15 Drawing Sheets

MOTORLESS POWER ELECTRONIC TEST DEVICE

CROSS-REFERENCE TO RELATED APPLICATION

This application claims priority to U.S. Provisional Patent Application No. 63/325,670 filed Mar. 31, 2022, the contents of which are incorporated by reference for all purposes, including purposes of priority.

TECHNICAL FIELD

The present invention is directed to electrical power test devices and, more particularly, to motorless power electronic test devices for testing AC motor drives without connecting motors to the drives under test, while feeding back the test power to minimize electric losses during the test procedures.

BACKGROUND

This section of this document introduces information about and/or from the art that may provide context for or be related to the subject matter described herein and/or claimed below. It provides background information to facilitate a better understanding of the various aspects of the technology described below. This is a discussion of "related" art. That such art is related in no way implies that it is also "prior" art. The related art may or may not be prior art. The discussion in this section of this document is to be read in this light, and not as admissions of prior art.

A variable frequency drive ("VFD"), also referred to as an adjustable speed drive ("ASD") or variable speed drive ("VSD"), for an alternating current ("AC") electric motor typically uses an electronic rectifier and an electronic power converter to drive the motor at variable speeds and power levels. The rectifier-converter pair may be referred to as the "motor drive" for descriptive convenience. The rectifier converts electric power from an AC source, such as a utility power line, to quasi-direct current ("DC") power. The electric power converter inverts the quasi-DC power to create AC power with variable frequency and power to adjust the speed and power output of the motor.

The electronic rectifier and power converter utilize high power switching, which injects significant levels of noise, referred to as common-mode and transient disturbances, into the voltage and current driving the motor. Unless suppressed, these power disturbances can create "nuisance faults" tripping breakers dropping the motor drives offline. Excessive electric noise also heats motors and electronic components reducing component lives and increasing maintenance costs. The motor drives must meet operational specifications for output voltage, current, frequency stability, noise generation, heating, and other performance metrics. The drives are therefore tested prior to going into service and during trouble shooting to ensure proper operation.

Conventional approaches dumping the test power into a very large power resistor, which is inefficient and adds to the operator's electricity cost and carbon footprint. Alternatively, full-load motor testing involves connecting the drive to a similarly rated motor, which is loaded up full-load for prolonged periods of time over the full range of operational frequencies and currents. This generally requires mechanically coupling an "absorber motor" to test motor, which is operated as an induction generator. While more energy efficient than dissipating the test energy as heat through a power resistor, this arrangement requires potentially large rotating machines coupled together and loaded to match the power converter's rating. This approach raises equipment transportation, set-up, interconnection, mechanical maintenance, and safety ramifications on a regular basis. There is, therefore, a continuing need for improved techniques for testing AC motors drives.

SUMMARY

The needs described above are met in a motorless power electronic test device ("test device") for selectively conducting full-power testing of an external power converter and an external rectifier without connecting and loading a motor when conducting the tests. The test device includes a bidirectional internal power converter, sinewave, common-mode and transient filter, a charging switch for charge capacitors of the internal and external power converters, line switches for setting the test mode and operating the test device, and a switch controller for operating the charging switch and the line switches to separately test the external power converter or the external rectifier, with the internal power converter operating in an AC-to-DC mode for testing the external power converter, and operating in a DC-to-AC mode for testing the external rectifier.

It will be understood that specific embodiments may include a variety of features and options in different combinations, as may be desired by different users. Practicing the invention does not require utilization of all, or any particular combination, of these specific features or options. The specific techniques and structures for implementing particular embodiments of the invention and accomplishing the associated advantages will become apparent from the following detailed description of the embodiments and the appended drawings and claims.

The above presents a simplified summary in order to provide a basic understanding of some aspects of the invention. This summary is not an exhaustive overview of the invention. It is not intended to identify key or critical elements of the disclosure or to delineate the scope of the invention. Its sole purpose is to present some concepts in a simplified form as a prelude to the following more detailed description, appended drawings, and claims.

BRIEF DESCRIPTION OF THE FIGURES

Illustrative embodiments of the subject matter claimed below will now be disclosed. In the interest of clarity, not all features of an actual implementation are described in this specification. It will be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort, even if complex and time-consuming, would be a routine undertaking for those of ordinary skill in the art having the benefit of this disclosure.

DETAILED DESCRIPTION

Figure 1A:
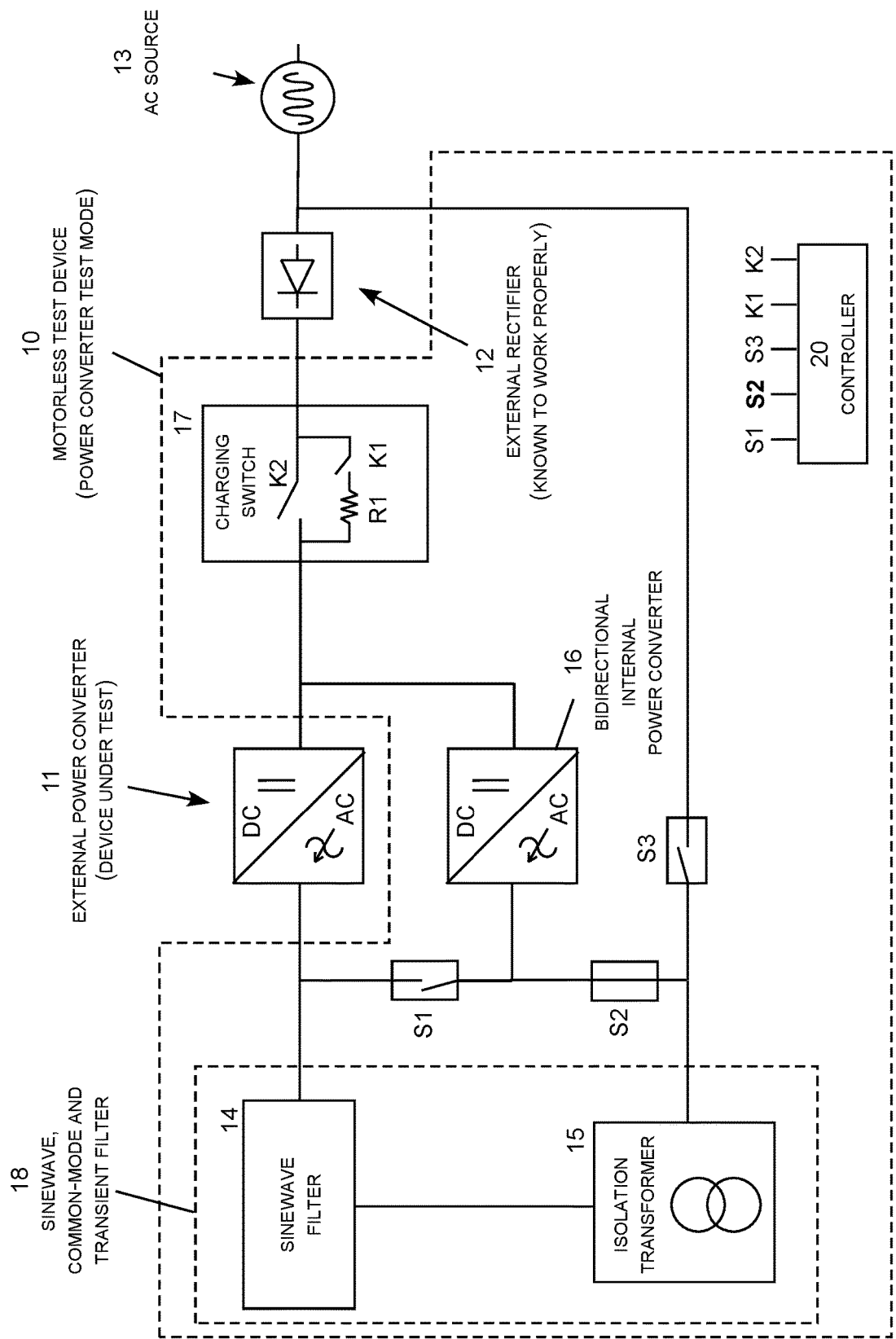
FIG. 1A is a one-line electric diagram of a motorless power electronic test device during a first step of a power converter test.

The present invention may be embodied in "motorless" power electronic test devices for testing adjustable speed AC motor drives without having to connect motors to the drive components under test. The motor drive includes an electronic rectifier to convert AC source power to quasi-DC power, and an electronic power converter to convert the quasi-DC power to variable frequency AC power. A representative embodiment of the test device is designed to selectively test a power converter, in a power converter test mode, and to separately test a rectifier, in a rectifier test mode. The bidirectional internal power converter of the test device operates in an AC-to-DC mode when testing an external power converter, and operates in a DC-to-AC mode when testing an external rectifier. The motorless power electronic test device may also be referred to as the "motorless test device" or the "test device" for descriptive convenience.

While the rectifiers and power converters are relatively light weight electronic components, the motors powered by the drives are much heavier and more cumbersome to transport and handle. The motorless power electronic test device is, therefore, much lighter and more convenient to handle than a test device that utilizes a motor and motor loading device to test the drive. As a result, the test device is more amenable to deployment as a portable unit that can be readily transported to customer sites to test installed motor drives.

In addition, conventional motor drive test devices are connected to motors, which are then loaded throughout the available drive frequency and power output ranges, which wastes significant energy during the testing process. The motorless power electronic test device, on the other hand, feeds back the test power rather than wasting the test power to reduce electric losses. The test device is designed to test power converters and rectifiers separately and utilize sinewave, common-mode and transient filter to mitigate electric noise to prevent the devices under test from dropping offline.

In the illustrated embodiments, the motorless test device includes terminals for connecting an external power converter and an external rectifier, either of which can be the devices under test ("DUT"). The terminals, which are shown schematically for the power converter in FIGS. 2A-2C, may be conventional high-power terminal blocks, which may be connected to power cords as appropriate for different test setups. The motorless test device also includes a bidirectional internal power converter, a sinewave, common-mode and transient filter, a charging switch for charge the capacitors of the internal and external power converters, line switches for setting the test mode and operating the test device, and a switch controller. The test device can be set to separately test an external power converter or an external rectifier, with the internal power converter operating in an AC-to-DC mode for testing an external power converter, and operating in a DC-to-AC mode for testing an external rectifier.

To test an external power converter, the external power converter under test and an external rectifier known to operate correctly are connected to the motorless test device. The motorless test device is set to the "power converter test mode," which sets internal switches to direct the power through the test device as desired for this mode. The external power converter is sequenced through its frequency and power ranges to test the unit, which includes full-power testing for prolonged periods of time throughout the available range of frequency settings. The external power converter under test converts the quasi-DC power from the rectifier to variable frequency AC power, which passes through the sinewave, common-mode and transient filter to mitigate common-mode and transient noise. In the external power converter test mode, the internal power converter converts the filtered AC power to DC power, which is fed back to the external power converter to mitigate test power losses.

To test an external rectifier, the external power converter is disconnected and the external rectifier under test is connected to the motorless test device. The motorless test device is set to the "rectifier test mode," which sets internal switches to direct the power through the test device as desired for this mode. The internal power converter is sequenced through its frequency and power ranges to test the external rectifier, which includes full-power testing for prolonged periods of time throughout the available range of frequency settings. The internal power converter converts the quasi-DC power generated by the external rectifier under test to variable frequency AC power. After passing through the sinewave, common-mode and transient filter to mitigate common-mode and transient noise, the filtered AC power is fed back to the external rectifier (the DUT) to mitigate test power losses.

When frequency converters are repaired or rebuilt, or they are part of a new installation, it is highly advantageous to perform a full-power test on the unit. Doing so for a prolonged period is very useful for burning in new components, catching infant mortality in components, and validating that the converter is fit for service in whatever critical application it may be destined for. For larger companies with stringent procurement requirements, full-power test is often a requirement when ordering or repairing a power converter.

The most common type of AC motor drive is a variable frequency drive ("VFD"), also referred to as an adjustable speed Drive ("ASD") or variable speed drive ("VSD"). Full-power testing an AC motor drive in a workshop customarily requires connecting the drive to a motor. Drawing sufficient current from that motor can be achieved with a mechanical connection to an absorber motor acting as induction generator, with an adjustable torque reference provided by another converter, which incurs significant mechanical and electrical losses. The test power, less the significant mechanical and electrical losses, is recycled back into the device under test ("DUT") via the common DC Link ("DCL").

For high-power drives (e.g., greater than 300 Amps), the test procedure requires correspondingly larger motors. Fully loading these large motors gets much more costly and difficult as the power capacity increases. Maintaining the moving parts of the motor-absorber machinery is an additional burden for the operator. Safety is a perpetual concern due to the heavy components, large electric currents, and high levels of spinning rotor inertia involved. Additionally, two large motors aligned into a semi-rigid coupling makes for a very cumbersome test setup requiring expensive transportation to the typical test site, such as a shipyard, rig-up yard, or customer site. The testing process also requires significant prep work before and after the test.

At present, a popular alternative to such large machinery is to connect the inverter into an inductive load bank ("ILB") using high-current inductors. This mode of testing feeds the output power from the drive under test (the DUT) into what "looks" to the drive like a motor stator and a locked rotor. As a result, the power output from the DUT surges to a very high current at a very low voltage. Along with this low voltage, the output frequency is low and generally cannot be raised to even 1.0 Hz due to the corresponding increase in inductor impedance, which causes less current to be drawn.

The ILB testing approach can impose the desired thermal stress on the DUT with minimal power consumption with the advantages of relatively low cost and small physical footprint compared to motor loading alternatives. This technique cannot, however, impose the maximum electrical stress on the DUT's semiconductors since it cannot come close to a 50% duty cycle in the pulse-width modulated ("PWM") output, which would equate to roughly 25 Hz output into a fully-loaded motor. While this technique imposes a high-current test, the conventional ILB test is inherently limited to very low voltage, low frequency, and short duration testing. As a result, the ILB test does not impose a full-voltage, full-power test on the drive under test for a prolong period of time. Nor does this type of test impose full-power testing for extended periods of time over the full variable frequency range. Conventional ILB testing of power converters is, therefore, inferior to full-load motor testing in a number of important ways.

Testing a high-power rectifier is more problematic still. Whereas a typical electronic inverter can output quasi-DC power with variable voltage when the source AC voltage varies, many industrial high-power rectifier assemblies feature integral undervoltage protection. As a result, these rectifiers only operate with an AC input voltage near rated line voltage. Because the output power is a function of both current and voltage, a rectifier connected to an ILB test load that "looks" like a motor stator and a locked rotor draws very high power when operating near the full line voltage. The rectifier must therefore be connected to a variable impedance test load to properly test the rectifier. In conventional test setups, the variable impedance includes a high-power variable resistor bank, which dissipates the test power increasing the operator's electric losses and carbon footprint.

The motorless test device disclosed herein effectively captures the benefits of the ILB testing by avoiding full-load motor testing, while also benefitting from full-power testing for prolonged periods of time over the full variable frequency range conventionally requiring full-load motor testing. The motorless test device includes a bidirectional internal power converter, sinewave, common-mode and transient filter, a charging switch for charge the capacitors of the internal and external power converters, switches for recycling test power from the DUT to mitigate testing losses. The motorless test device thus avoids inertial motors and large resistor banks that inherently waste significant test power. Additionally, the system can be made portable for as-needed testing of a specific installation since there is no moving machinery to keep aligned.

When an external power converter test is the device under test (the DUT), a rectifier known to operate properly is connected to provide DC link ("DCL") to power the DUT. A charging circuit initially energizes the DCL and charges the capacitors in the DUT and the internal power converter. With full DCL input voltage, the DUT is initiated with zero power reference applying zero volts to the AC Link (ACL) output from the DUT. The controller of the external power converter turns on the PWM control of the semiconductors (IGBTs) within the DUT, ramping up from 0.1 Volts/0.1 Hz to the desired setpoint voltage and frequency with minimal output current.

At the setpoint voltage with minimal current, there will be minimal load, consisting mainly of electronic filtering and magnetically coupled core excitation losses. The output power reference of the DUT then is increased, which increases the ACL current output from the DUT. The IGBTs of the external power converter begin PWM modulating output current pulses, which the internal power converter converts to DC and feeds back to the DCL. The DUT is sequenced through its variable power and frequency including full-power testing for prolonged periods of time throughout the available frequency settings. The AC output of the DUT is magnetically filtered, converted to DC by the internal power converter, and then fed back into the input of the DUT. Since the test power is recycled, the test power losses are reduced to the electronic power conversion and filtering losses, which are less than 10% of the test power flowing through the DUT.

With the operation of the setup switches and removal of the external power converter, the same motorless test device may be utilized to test a rectifier, which typically include electronic diodes, thyristors, or both. A charging circuit engages the rectifier under test and charges the capacitors in the internal power converter. Once the internal power converter is charged, the main infeed switch is closed, leaving full AC Link voltage on the rectifier under test and full DC Link voltage on the input of the internal voltage converter. The internal voltage converter is initiated with zero power reference. The rectifier is therefore energized with near-zero current passing through it. The power reference of the internal power is then increased causing its IGBTs to begin modulating the PWM to the AC output. The internal power converter is then sequenced through its frequency and power ranges to test the rectifier, which includes full-power testing for prolonged periods of time throughout the available range of frequency settings.

The AC output from the internal power converter passes through the sinewave, common-mode and transient filter and is fed back to the AC input of the rectifier under test. Since the test power is recycled, the test power losses are reduced to electronic power conversion and filtering losses, which are less than 10% of the test power flowing through the DUT.

While there is a possibility that some types of external devices could be tested without common-mode and transient filtering, the electric power noise can be compounded by recycling the power in a feedback loop. In particular, the controllers of certain power converters are known to be more sensitive to common-mode and transient disturbances than others. For certain devices under test, an unfiltered motorless test feedback loop could potentially cause nuisance faults unpredictably dropping the devices offline. In addition, it has been found that the stresses on the electronic components, which are audible via piezoelectric effects, are greatly reduced when common-mode and transient filtering is used, at least in part due to blocking or dampening the common-mode and transient noise created by the electronic rectifiers and power converts. The illustrative embodiments of the motorless test device therefore include common mode and transient filtering, which may also be referred to as "dv/dt" filtering, to reduce noise in the test circuit, avoid nuisance faults, and provide testing flexibility.

One option for the sinewave, common-mode, and transient filter includes a sinewave filter (e.g., low-pass filter) and an isolation transformer. The sinewave filter removes high-frequency components, while the magnetically-coupled flux core of the isolation transformer serves as an effective high-frequency "choke" reducing the common mode and transient effects. While this option is effective up to very high current and power levels, the isolation transformer carries the full line current of the full-power tests. Three single-phase, high-power transformers in separate enclosures are typically required, which may be wired to a 3-phase sinewave filter in a separate enclosure. This can be a relatively heavy and expensive alternative because, in this application, the high-power voltage transformers are utilized in an application not requiring voltage transformation. Commercially available 3-phase common-mode and transient filters, which tie three phase filters together in a single enclosure, may provide less expensive options for the sinewave, common-mode, and transient filter. These alternatives include 3-phase resistive-reactive filters and "tri-core" filters utilizing less massive, lower-current magnetic coupling in comparison to similarly rated isolation transformers.

While the invention is susceptible to various modifications and alternative forms, the drawings illustrate representative embodiments of the invention by way of example. It should be understood, however, that the description of specific examples is not intended to limit the invention to the particular forms disclosed, but on the contrary, the intention covers all modifications, equivalents, and alternatives falling within the spirit and scope of the invention as defined by the appended claims.

FIG. 1A shows a representative embodiment, motorless test device 10, which can be set to separately test an external power converter 11 or an external rectifier 12 powered by an AC power source 13, such as a utility power line. FIG. 1A is a one-line electric diagram of a motorless test device 10 during a first step of a power converter test. The motorless test device 10 includes a bidirectional internal power converter 16, which operates in an AC-to-DC mode for testing the external power converter 11, and operates in a DC-to-AC mode for testing the external rectifier 12. The motorless test device 10 also includes a sinewave, common-mode, and transient filter 18, which in this embodiment includes a sinewave filter 14 (e.g., low-pass filter) and an isolation transformer 15. In this particular representative embodiment, the filtering includes a sinewave filter 14 (e.g., low-pass filter) and an isolation transformer 15, which may have a substantially one-to-one turns ratio (sometimes referred to as an auto-transformer). The motorless test device 10 includes a charging switch 17 including switches K1, K2 and a current limiting resistor R1 for charging the capacitors of the internal and external power converters 11 and 16. The motorless test device 10 also includes line switches S1-S3 for setting the test mode and operating the device, and a switch controller 20 for operating the charging switches K1-K2 and line switches S1-S3.

When the external power converter 11 is the device under test (the "DUT"), the technician connects the external power converter and an external rectifier 12 known to operate properly to the motorless test device 10. The test device is set to the external power converter test mode, which causes the switch controller 20 to close switch S2, while opening switches S1 and S3 to connect the output of the rectifier 12 to the DC input of the external power converter 11 when the charging switch 17 is closed. FIG. 1A shows the motorless test device 10 after the external power converter 11 and external rectifier 12 have been connected, but before the charging switch 17 has been closed to energize the circuit.

Figure 1B:
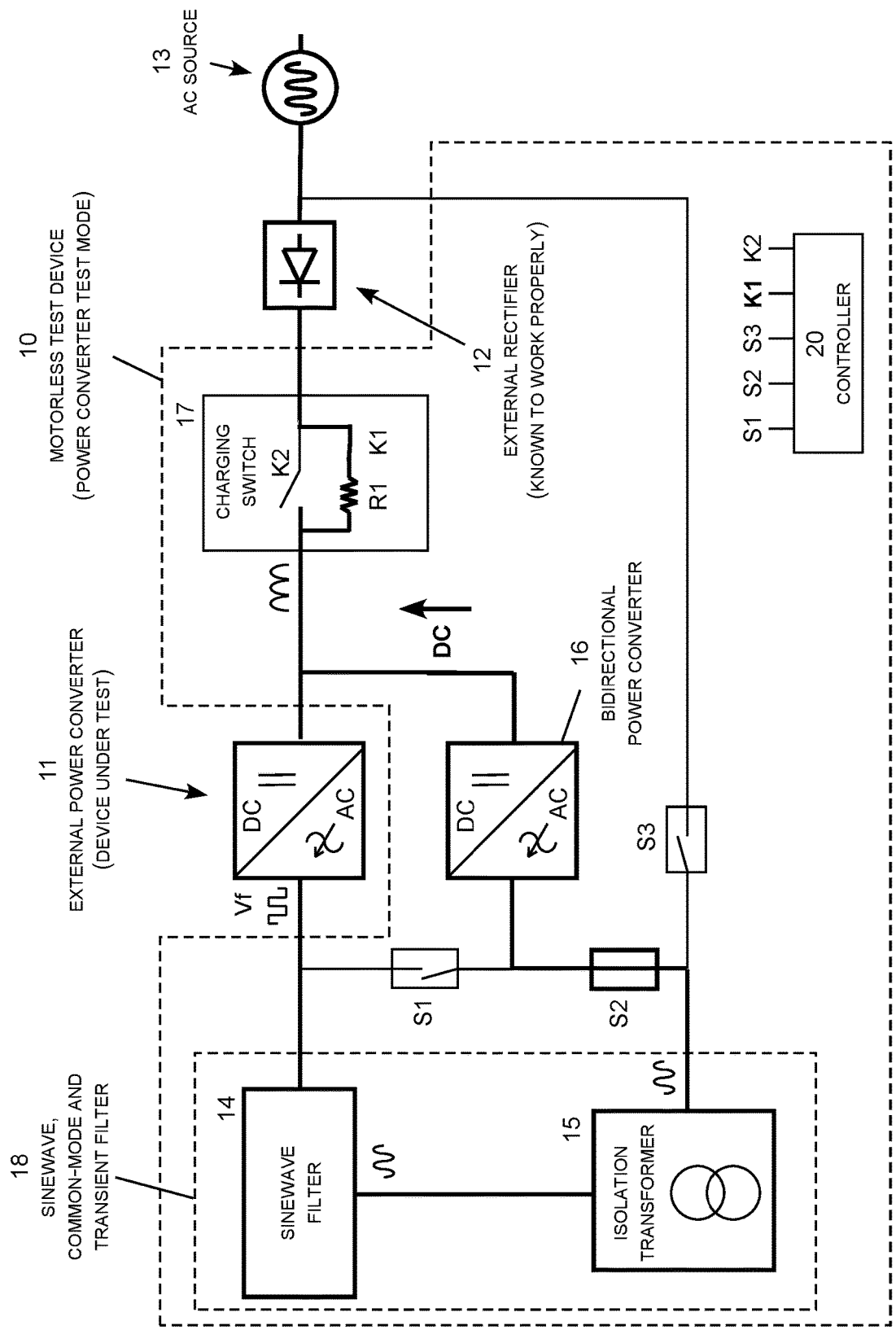
FIG. 1B is a one-line electric diagram of the motorless power electronic test device during a second step of the power converter test.

FIG. 1B shows the test circuit after the switch controller 20 closes charging switch K1, which energizes the test circuit through the current-limiting resistor R1. This charges the capacitors in the internal and external power converters 11 and 16, while limiting the capacitor charging inrush current. The test circuit current path includes AC current from the AC source 13 to the external rectifier 12, which creates quasi-DC current fed to the DC input of the external power converter 11. The variable frequency, variable power AC output from the external power converter 11 passes through the sinewave, common-mode and transient filter 18, to the AC input of the bidirectional internal power converter 16. In this particular embodiment, the sinewave, common-mode and transient filter 18 includes the sinewave filter 14 and the isolation transformer 15. The bidirectional internal power converter 16 operates in the AC-to-DC mode, in which the DC output of the internal power converter is fed back to the DC input of the external power converter 11 to recycle the test power.

Figure 1C:
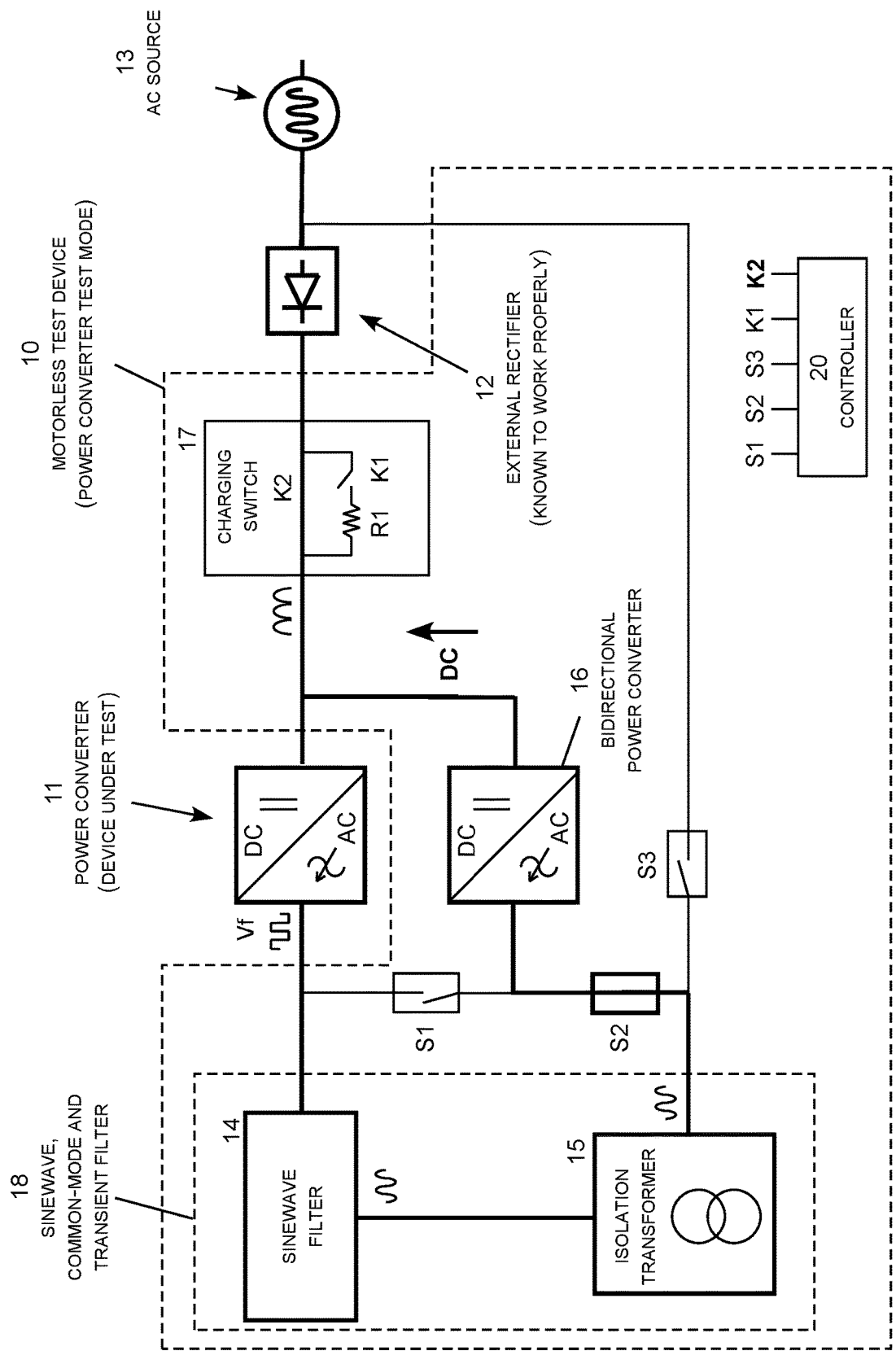
FIG. 1C is a one-line electric diagram of the motorless power electronic test device during a third step of the power converter test.

Once the capacitors are charged, the switch controller 20 opens switch K1 and closes the main power switch K2 as shown in FIG. 1C, with the reference voltage, power, and frequency of the external power converter 11 set to zero. As an option at this point, the technician may connect a signal analyzer to the test circuit and increase the reference voltage to its setpoint level, typically the line voltage of the AC source 13. The technician may then increase the reference power to a moderate level, and check the common-mode and transient noise content. If available, the technician may connect the sinewave filter 14 to an electric ground, and operate ground switches of the motorless test device 10 (e.g., switches S4 and S5 in FIG. 3) to connect a 3-phase neutral of the sinewave filter to electric ground, with and without a current-limiting resistor, to find the lowest noise configuration.

Once the motorless test device has been set to its lowest available noise configuration, the technician sequences the external power converter 11 through its variable power and variable frequency settings, including full-power testing for prolonged periods of time throughout the available range of frequency settings. While this type of full-power test would incur considerable electric and mechanical losses in a comparable full-load motor test, the motorless test device 10 only incurs minimal circuit losses in the internal and external power converters 11 and 16, sinewave filter 14, and the isolation transformer 15 well less than 10% of the power flowing in the test circuit.

Figure 2A:
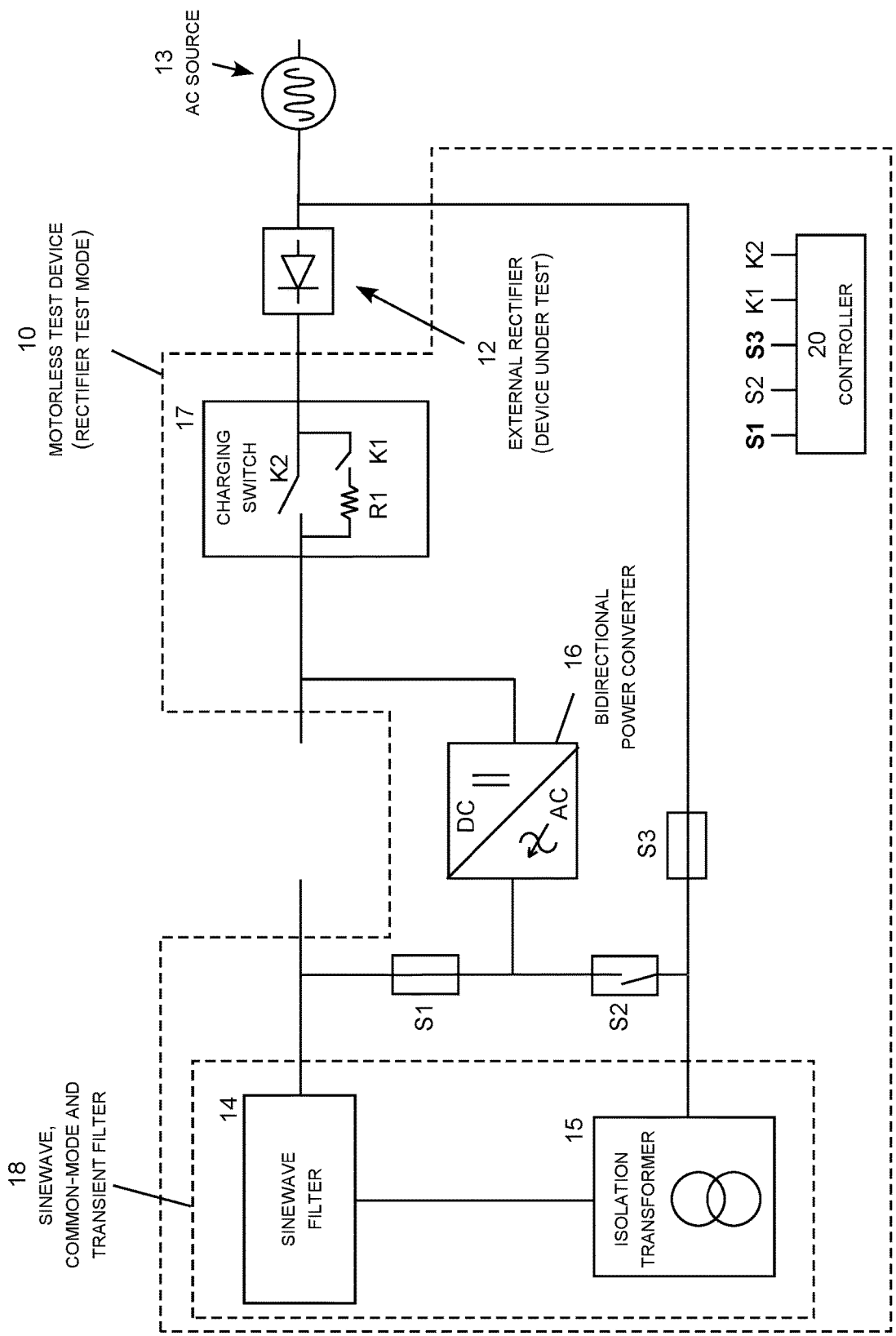
FIG. 2A is a one-line electric diagram of a motorless power electronic test device during a first step of a rectifier test.

FIG. 2A is a one-line electric diagram of a motorless test device 10 during a first step of a rectifier test mode. The motorless test device 10 can be set to separately test the external rectifier 12 by disconnecting (or not connecting in the first place) the external power converter 11, connecting the external rectifier 12 to be tested, and placing the motorless test device in the rectifier test mode. This causes the switch controller 20 to open switch S2, while closing switches S1 and S3 to connect the output of the rectifier 12 to the DC input of the internal power converter 11 when the charging switch 17 is closed. FIG. 2A shows the motorless test device 10 after the external rectifier 12 under test has been connected, but before the charging switch 17 has been closed to energize the test circuit.

Figure 2B:
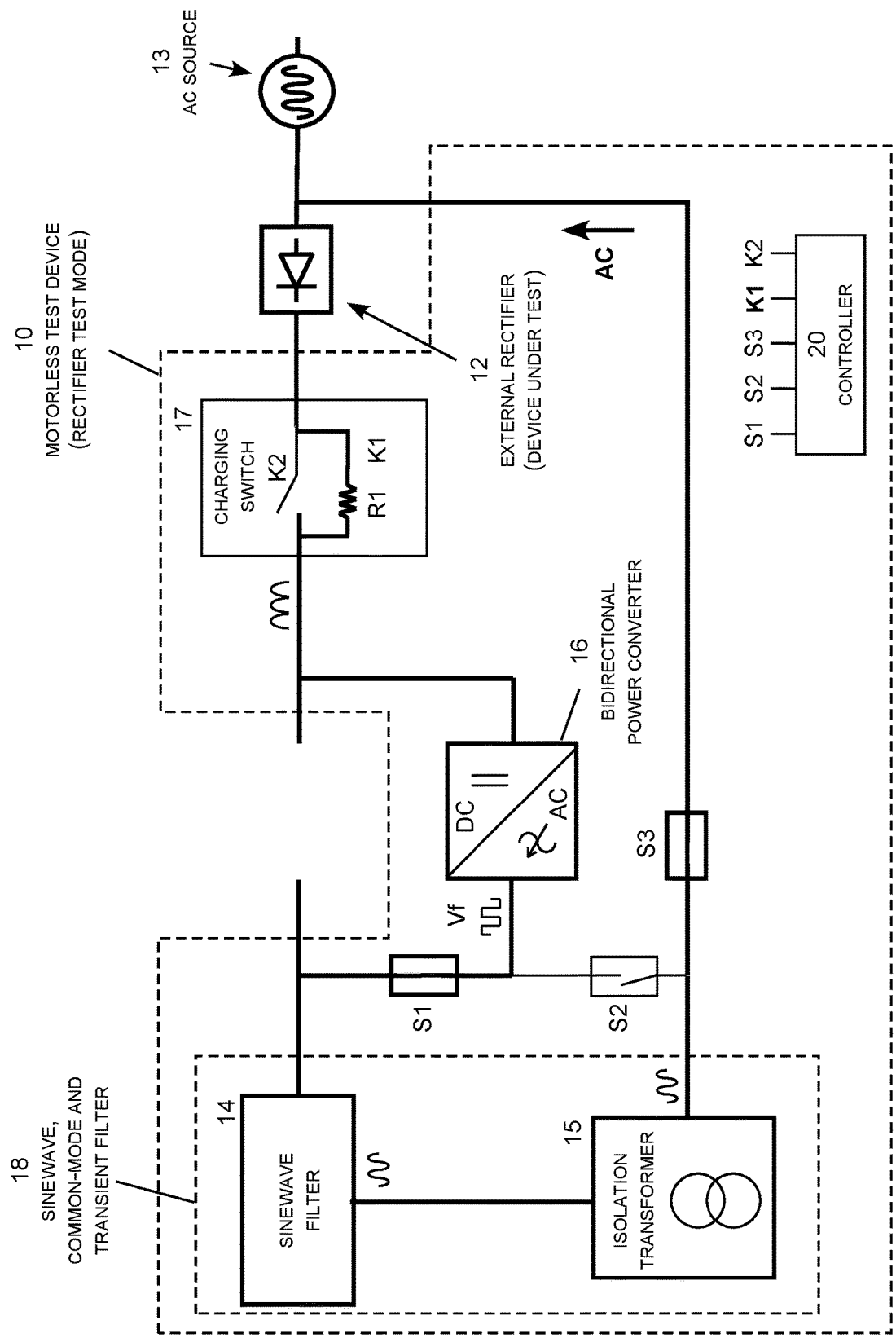
FIG. 2B is a one-line electric diagram of the motorless power electronic test device during a second step of the rectifier test.

FIG. 2B shows the test circuit after the switch controller 20 closes switch K1, which energizes the circuit through the current-limiting resistor R1. This charges the capacitors in the internal power converter 16, while limiting the capacitor charging inrush current. The test circuit current path includes AC current from the AC source 13 to the external rectifier 12, which creates quasi-DC current fed to the DC input of the internal power converter 16. With the bidirectional internal power converter 16 operating in the DC-to-AC mode, the AC output of the internal power converter is fed back to the AC input of the external rectifier 12 to recycle the test power.

Figure 2C:
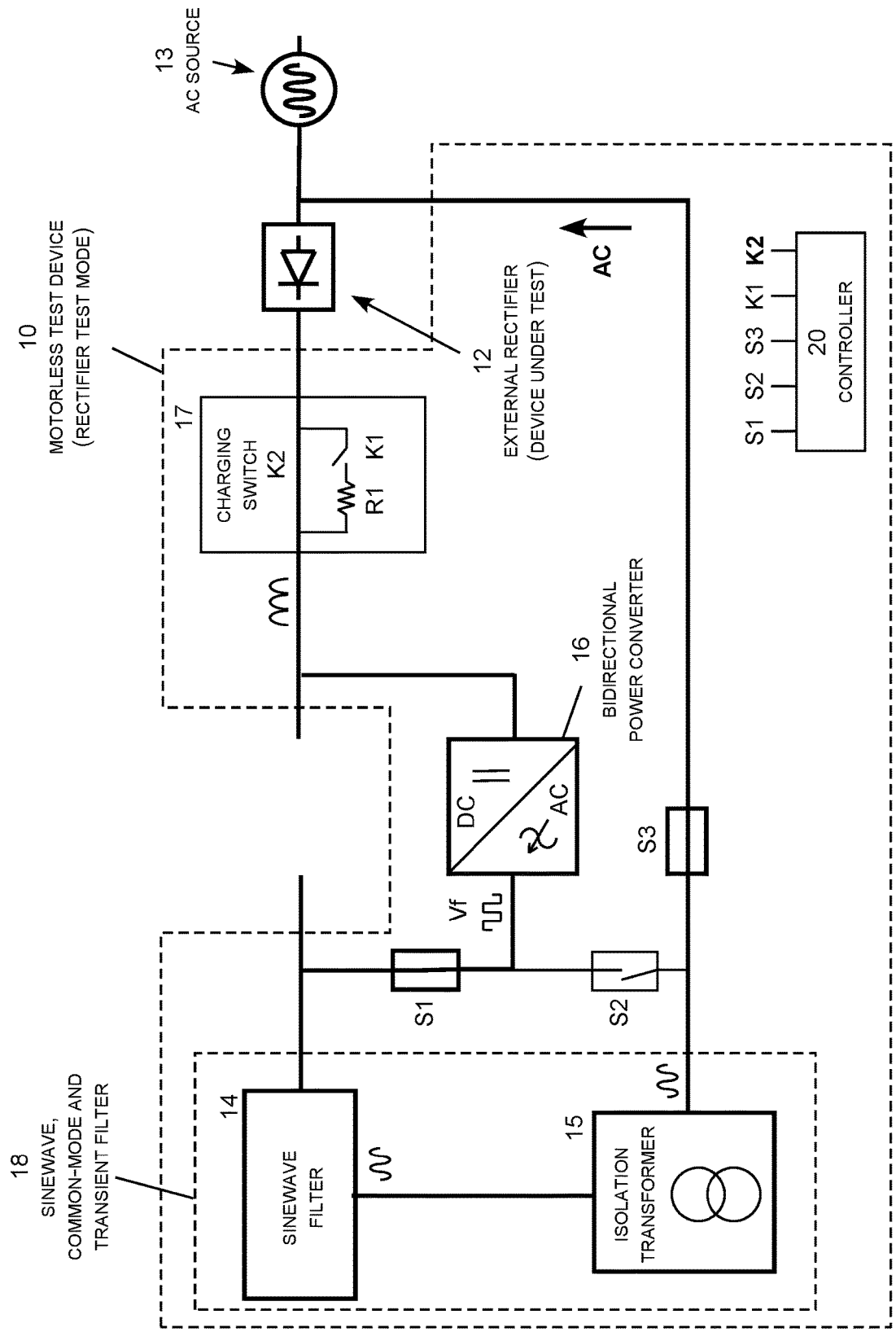
FIG. 2C is a one-line electric diagram of the motorless power electronic test device during a third step of the rectifier test.

Once the capacitors are charged, the switch controller 20 opens switch K1 and closes the main power switch K2 as shown in FIG. 2C, with the reference voltage, power, and frequency of the internal power converter 16 set to zero. As an option at this point, the technician may connect a signal analyzer to the test circuit and increase the reference voltage to its setpoint level, typically the line voltage of the AC source 13. The technician may then increase the reference power to a moderate level, and check the common-mode and transient noise content. If available, the technician may connect the sinewave filter 14 to an electric ground, and operate ground switches of the motorless test device 10 (e.g., switches S4 and S5 in FIG. 3) to connect a 3-phase neutral of the sinewave filter to electric ground, with and without a current-limiting resistor, to find the lowest noise configuration.

Once the motorless test device has been set to its lowest available noise configuration, the technician sequences the internal power converter 16 through its variable power and variable frequency settings, including full-power testing for prolonged periods of time throughout the available range of frequency settings. While this type of full-power test would incur considerable electric and mechanical losses in a comparable full-load motor test, the motorless test device 10 only incurs minimal circuit losses in the internal power converter 11, sinewave filter 14, and the isolation transformer 15 well less than 10% of the power flowing in the test circuit.

Figure 3:
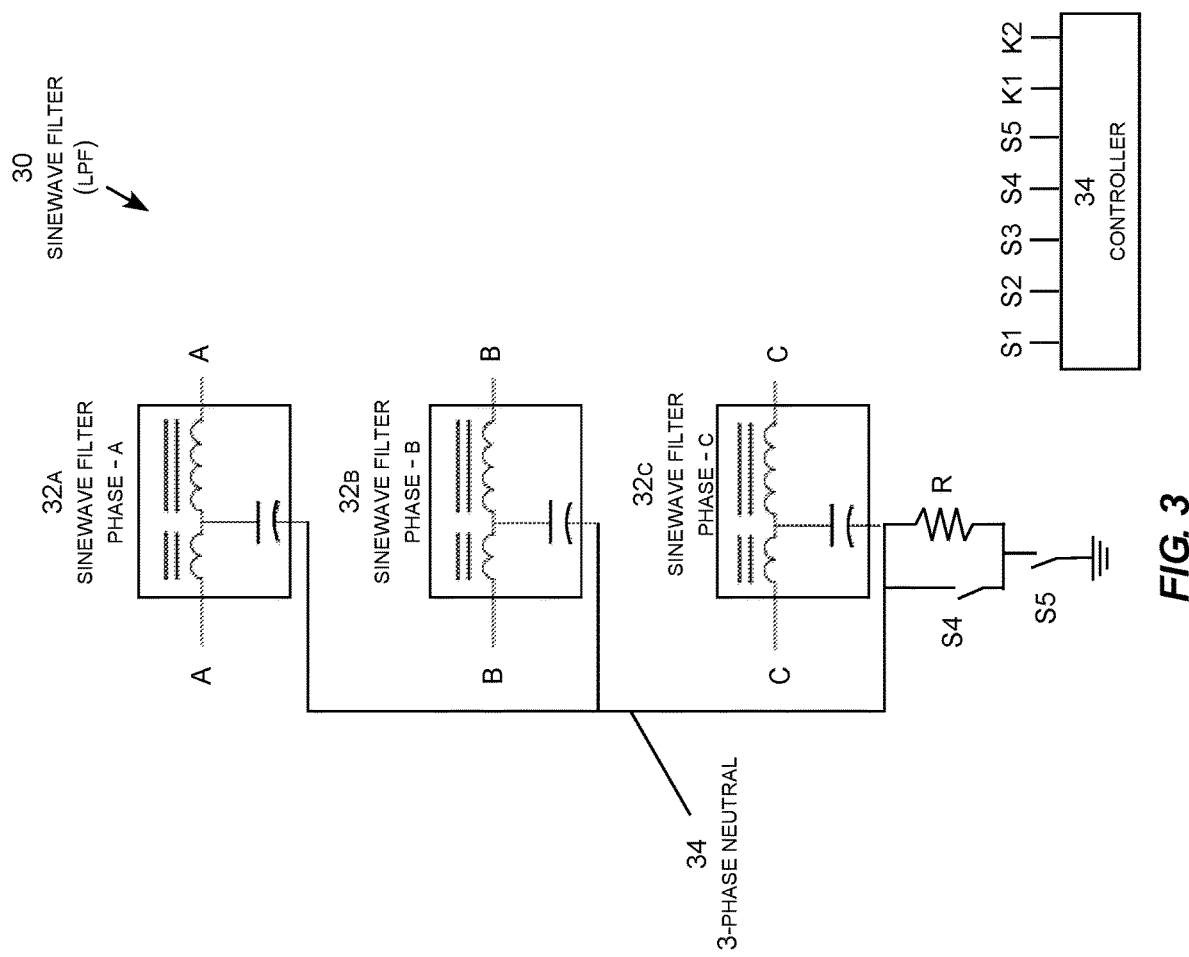
FIG. 3 is a one-line electric diagram of a sinewave filter of the motorless power electronic test device.

FIG. 3 is a one-line electric diagram of a representative sinewave filter 30 of the motorless test device 10, which includes three single-phase sinewave filter legs 32A-32C, one for each electric phase. Each common-mode and transient filter includes a series connected magnetic core inductor and a shunt capacitor with outputs of the shunt capacitors connected together forming a 3-phase neutral 34. A signal analyzer, such as an oscilloscope, can be connected to the test power circuit to observe the level of common-mode and transient noise on the test circuit, which may vary for different types of external power converters and rectifiers. As an option when an electric ground is available, the motorless test device 10 may also include additional switches S4 and S5 that can be operated in an effort to further reduce the noise level. Switches S4 and S5 can be closed to directly connect the 3-phase neutral to ground. As a further attempt to reduce the noise level, switch S4 can be opened, while switch S5 remains closed, to connect the 3-phase neutral to ground through the current-limiting resistor R. Connecting the 3-phase neutral to ground directly or through the current-limiting resistor R without a "DC-blocking" capacitor connected in series may dissipate any DC-offset current on the 3-phase neutral, which may bring down the noise level. A "DC-blocking" capacitor may be also connected in series between the 3-phase neutral and ground, with and without the current-limiting resistor R, as additional filtering options. Other conventional sinewave filtering techniques may be utilized as a matter or design choice.

The sinewave, common-mode and transient filter options shown in FIGS. 1A-1C, FIGS. 2A-2C, and FIG. 3 include the isolation transformer 15 in addition to the sinewave filter 14. While the isolation transformer are available up to very high current and power levels, they carry the full line current of the test circuit, which includes full-power testing for prolonged periods of time at the full range of available frequency settings. Three separate single-phase transformers in separate enclosures are typically required, along a 3-phase sinewave filter in another separate enclosure. Using high-power voltage transformer for this application can be a relatively heavy, cumbersome, and expensive alternative because voltage transformation is generally not required. Commercially available 3-phase common-mode and transient filters in a single enclosure may provide less expensive sinewave, common-mode and transient filter options. This approach is similar to the sinewave filter 30 shown in FIG. 3 with additional filtering techniques used to avoid the need for 3-phase isolation transformers.

Figure 4:
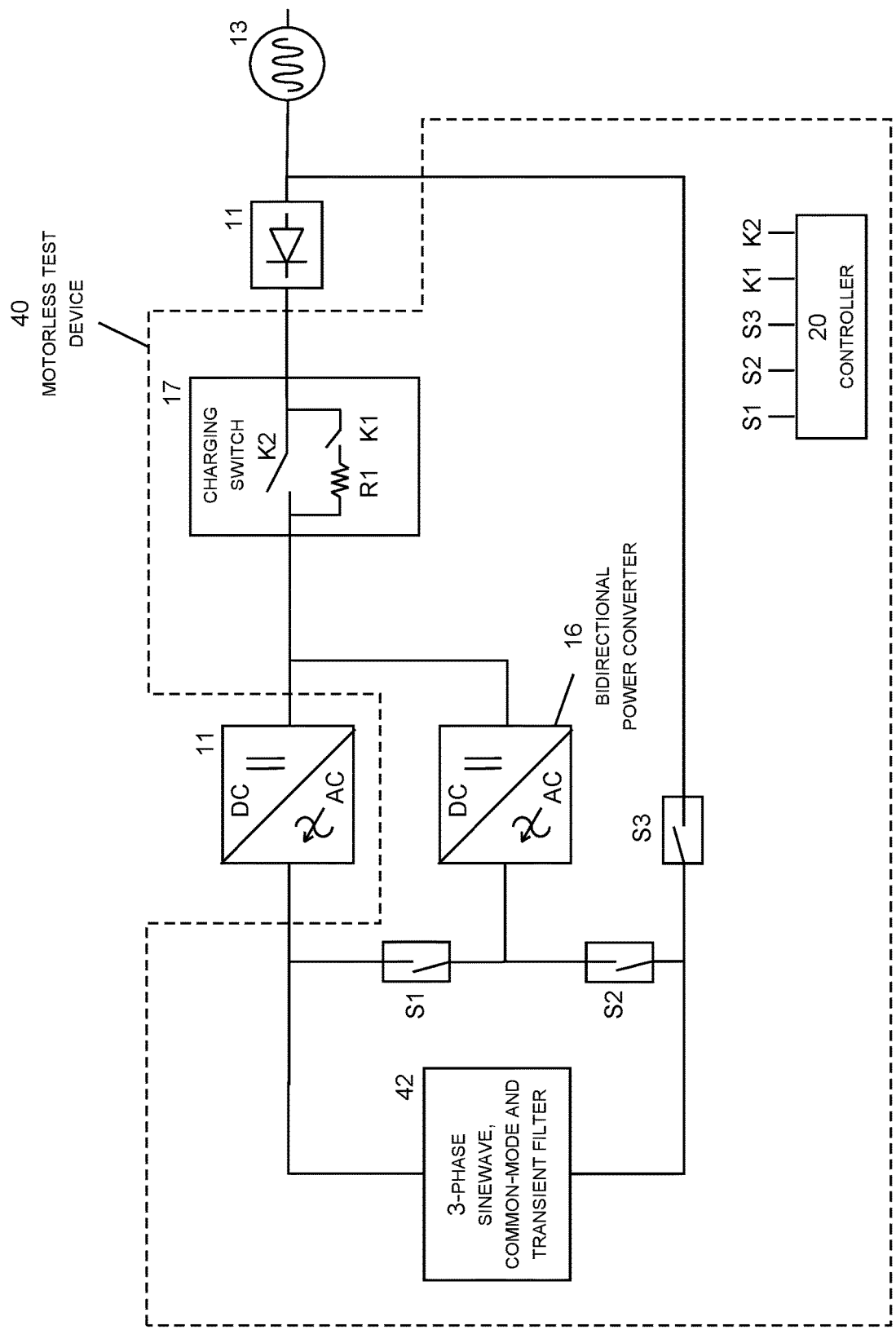
FIG. 4 is a one-line electric diagram of an alternative motorless power electronic test device utilizing a 3-phase common-mode and transient filter.
Figure 5:
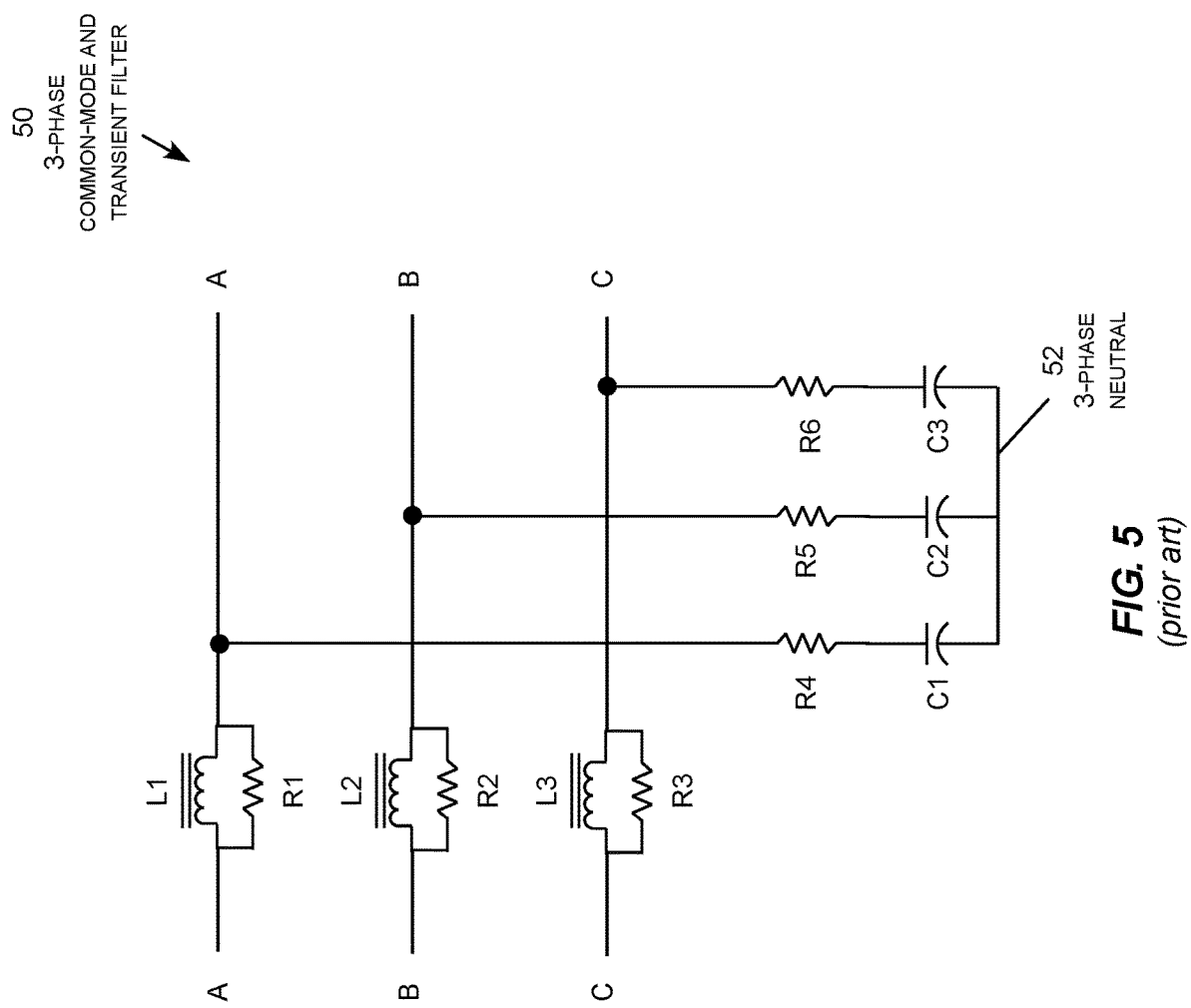
FIG. 5 (prior art) is a one-line electric diagram of a 3-phase common-mode and transient filter.

FIG. 4 is a one-line electric diagram of an alternative motorless test device 40 utilizing a 3-phase common-mode and transient filter 42 replacing the sinewave filter 14 and isolation transformer 15 shown in FIGS. 1A-1C and 2A-2C. For example, FIG. 5 (prior art) is a one-line electric diagram of a commercially available common-mode and transient filter 50, such as the V1K KLC-Series Motor Protection Filter available from TCI®. FIG. 5 is reproduced from the publicly available VK1 Installation Guide. The VK1 filter includes, for each phase, a resistor and a magnetic core inductor connected in series, along with a shunt leg for each phase including a resistor and a capacitor connected in series. The outputs of the shunt legs are connected together forming a 3-phase neutral 52. While the VK1 filter is designed for connection in series between the motor drive and the motor, a motorless test unit connecting this type of filter between two power converters, or between a rectifier and a power converter, to recycle test power is suggested in the TCI literature reviewed or otherwise described in the literature or engineering practice known to the Applicant.

This option may be used as illustrated or with the grounding switches S4 and S5 and current limiting resistor R shown in FIG. 3.

Figures 6, 7:
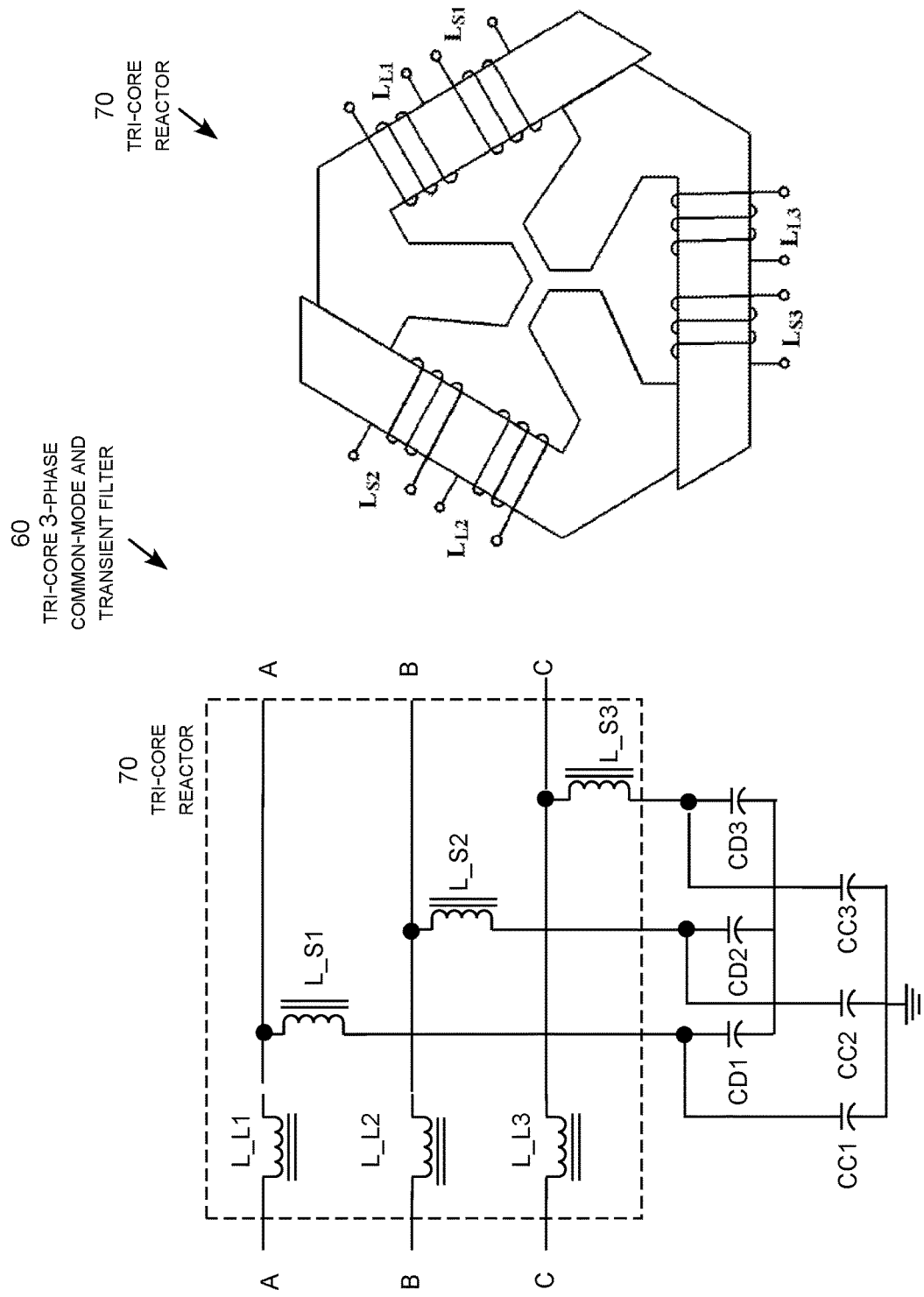
FIG. 6 (prior art) is a one-line electric diagram of a tri-core common-mode and transient filter.
FIG. 7 (prior art) is a one-line electric diagram of a tri-core reactor.

FIG. 6 (prior art) is a one-line electric diagram of another filtering option, a commercially available "dv/dt" common-mode and transient filter 60 using a tri-core reactor 70 available from MTE®. FIG. 7 (prior art) is conceptual illustration of the tri-core reactor. Both of these diagrams are reproduced from the publicly available MTE literature. As shown in these figures, the tri-core common-mode and transient filter 60 is a "delta-Y" connected filter magnetically coupling six winding on a three-sided magnetic flux core. While the tri-core filter is designed for connection in series between the motor drive and the motor, a motorless test unit connecting this type of filter between two power converters, or between a rectifier and a power converter, to recycle test power is not disclosed or suggested in the MTE literature reviewed or otherwise described in the literature or engineering practice known to the Applicant. Again, this option may be used as illustrated or with the grounding switches S4 and S5 and current limiting resistor R shown in FIG. 3.

Figure 8:
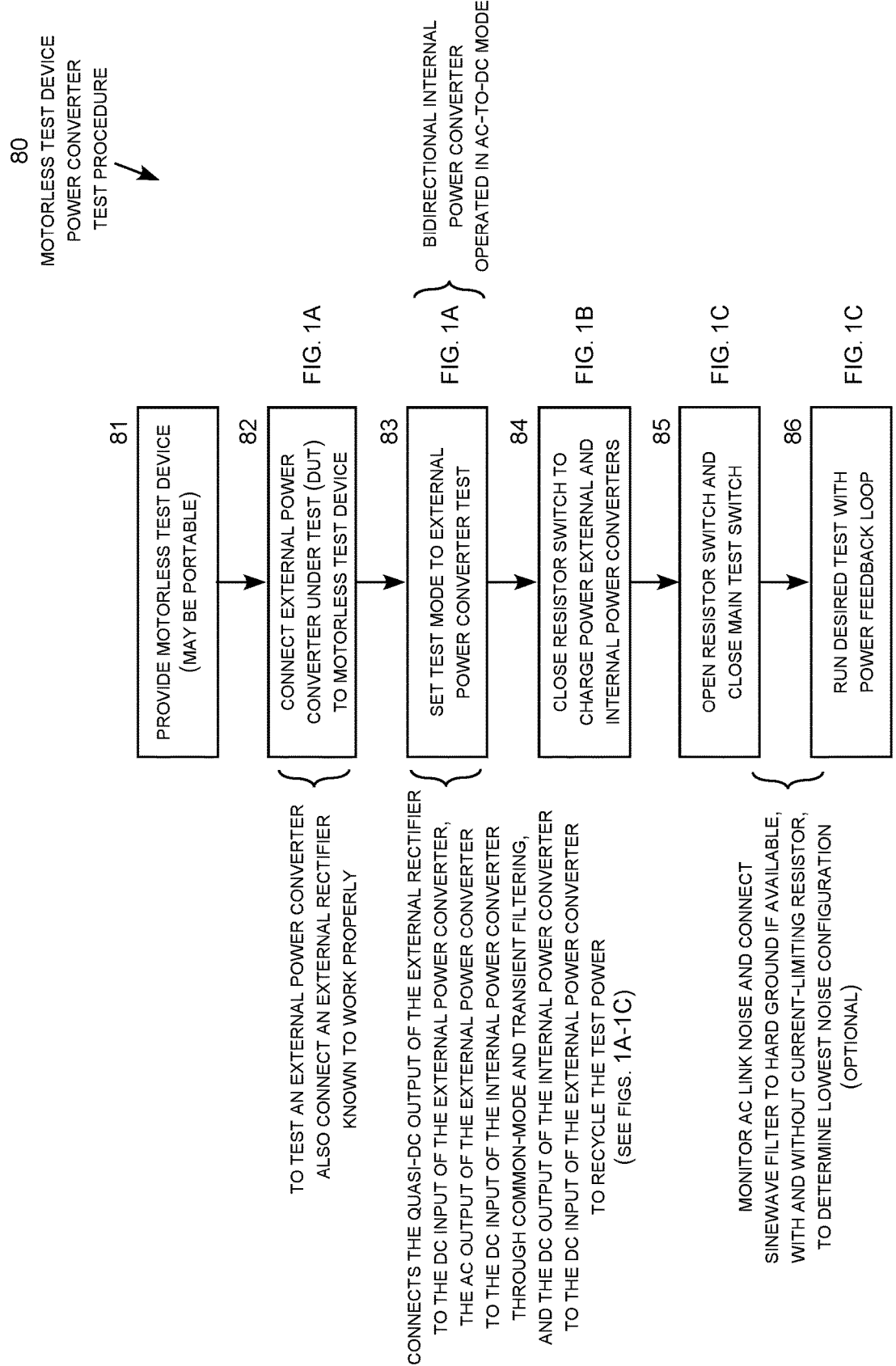
FIG. 8 is a logic flow diagram of a power converter test procedure for the motorless test device.

FIG. 8 is a logic flow diagram illustrating a test procedure 80 for using the motorless test device to test an external power converter. In step 81, the motorless test unit is provided, which may a portable unit taken to a testing site by a technician to conduct on-site motor drive testing. Step 81 is followed by step 82, in which the technician connects the motorless test device to the external power converter under test. Step 82 is followed by step 83, in which the technician sets the motorless test device to the external power converter test mode. This connects the quasi-DC output of the external rectifier to the DC input of the external power converter, the AC output of the external power converter to the DC input of the internal power converter through sinewave, common-mode and transient filter, and the DC output of the internal power converter to the DC input of the external power converter to recycle the test power, as shown in FIGS. 1A-1C. For the external power converter test, the bidirectional internal power converter operates in the AC-to-DC mode.

Step 83 is followed by step 84, in which the switch controller closes the resistor switch of the charging switch to charge the capacitors in the internal and external converters. Step 84 is followed by step 85, in which the switch controller opens the resistor switch and closes the main power switch of the charging switch. As an option at this point, the technician may connect a signal analyzer to the AC link, increase the voltage reference to the voltage setpoint (typically the AC source line voltage), increase the reference power to a moderate level, and monitor the noise on the AC portion of the test circuit. If an electric ground is available, the technician may try connecting the 3-phase neutral of the filter to ground with and without a current-limiting resistor in the circuit to find the lowest noise configuration.

Step 85 is followed by step 86, in which the technician runs the desired test with the power feedback loop connected. This involves sequencing the external power converter through its frequency and power ranges, which includes full-power testing for prolonged periods of time throughout the available range of frequency settings. Rather than wasting the test power as occurs with conventional full-load motor testing, the test power is recycled to mitigate electric losses during the test.

Figure 9:
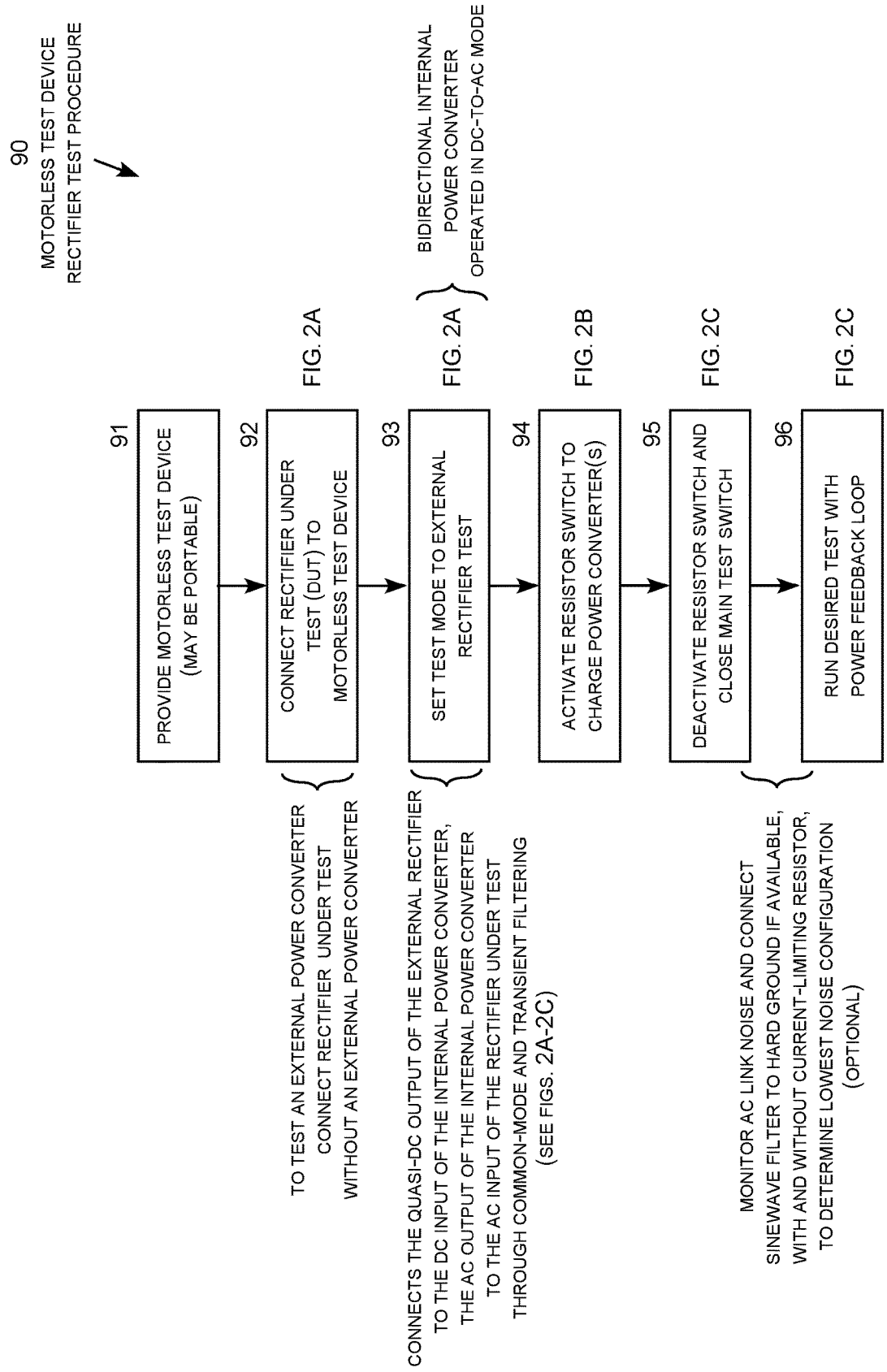
FIG. 9 is a logic flow diagram of a rectifier test procedure for the motorless test device.

FIG. 9 is a logic flow diagram illustrating a test procedure 90 for using the motorless test device to test an external rectifier. In step 91, the motorless test unit is provided, which may a portable unit taken to a testing site by a technician to conduct on-site motor drive testing. Step 91 is followed by step 92, in which the technician connects the motorless test device to the external rectifier under test. For the external rectifier test, the external rectifier under test is connected without an external power converter connected. Step 92 is followed by step 93, in which the technician sets the motorless test device to the external rectifier test mode. This connects the quasi-DC output of the external rectifier to the DC input of the internal power converter, and the AC output of the internal power converter to the AC input of the external rectifier through sinewave, common-mode and transient filter to recycle the test power, as shown in FIGS. 2A-2C. For the external rectifier test, the bidirectional internal power converter operates in the DC-to-AC mode.

Step 93 is followed by step 94, in which the switch controller closes the resistor switch of the charging switch to charge the capacitors in the internal power converter. Step 94 is followed by step 95, in which the switch controller opens the resistor switch and closes the main power switch of the charging switch. As an option at this point, the technician may connect a signal analyzer to the AC link, increase the voltage reference to the voltage setpoint (typically the AC source line voltage), increase the reference power to a moderate level, and monitor the noise on the AC portion of the test circuit. If an electric ground is available, the technician may try connecting the 3-phase neutral of the filter to ground with and without a current-limiting resistor in the circuit to find the lowest noise configuration.

Step 95 is followed by step 96, in which the technician runs the desired test with the power feedback loop connected. This involves sequencing the internal power converter through its frequency and power ranges, which includes full-power testing for prolonged periods of time throughout the available range of frequency settings. Rather than wasting the test power as occurs with conventional full-load motor testing, the test power is recycled to mitigate electric losses during the test.

Figure 10:
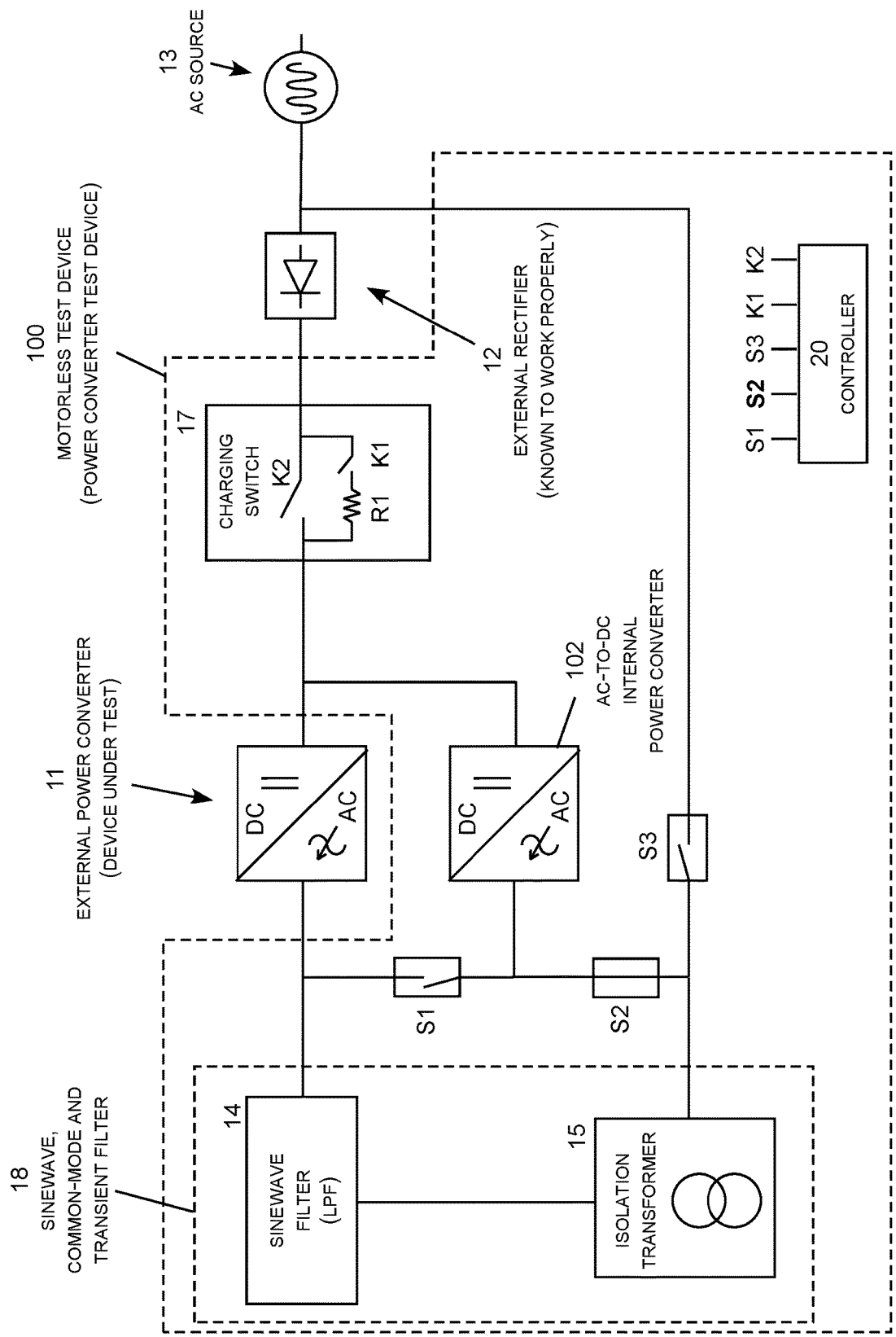
FIG. 10 is a one-line diagram of an alternative motorless test device for testing external power converters.
Figure 11:
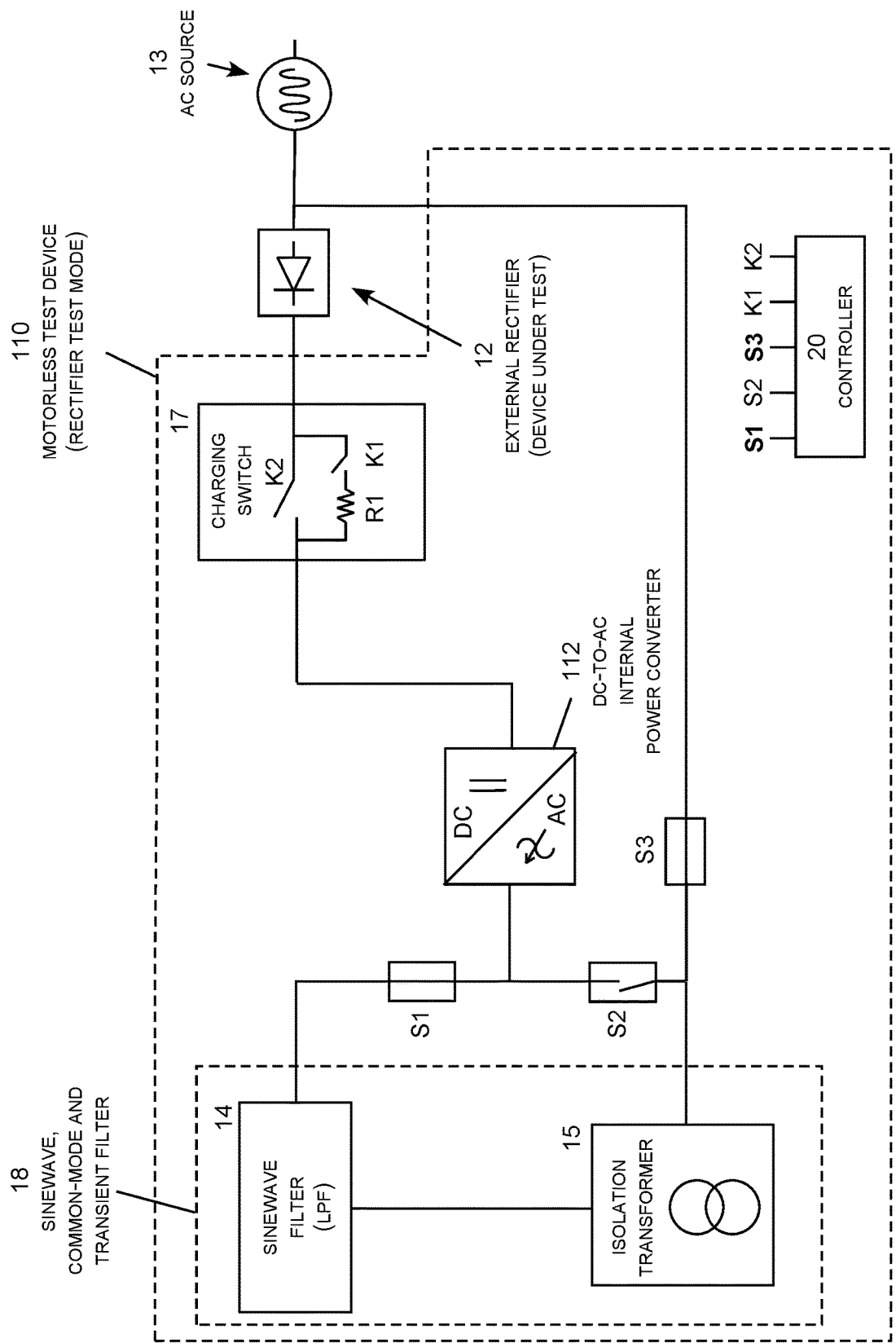
FIG. 11 is a one-line diagram of another alternative motorless test device for testing external rectifiers.

It will be appreciated that the illustrative examples described above include a bidirectional internal power converter 16 for selectively testing external power converters or external rectifiers, with the bidirectional internal power converter operating in an AC-to-DC mode when testing an external power converter, and operating in a DC-to-AC mode when testing an external rectifier. FIG. 10 shows an alternative motorless test device 100 configured for testing an external power converter, in which the bidirectional internal power converter is replaced by an AC-to-DC internal power converter 102. FIG. 11 shows another alternative motorless test device 110 configured for testing external rectifiers, in which the bidirectional internal power converter is replaced by a DC-to-AC internal power converter 112. These motorless test devices with unidirectional internal power converters can utilize the same alternatives and options described for the motorless test device 10 with the bi-directional internal power converter 16 described previously.

Figure 12:
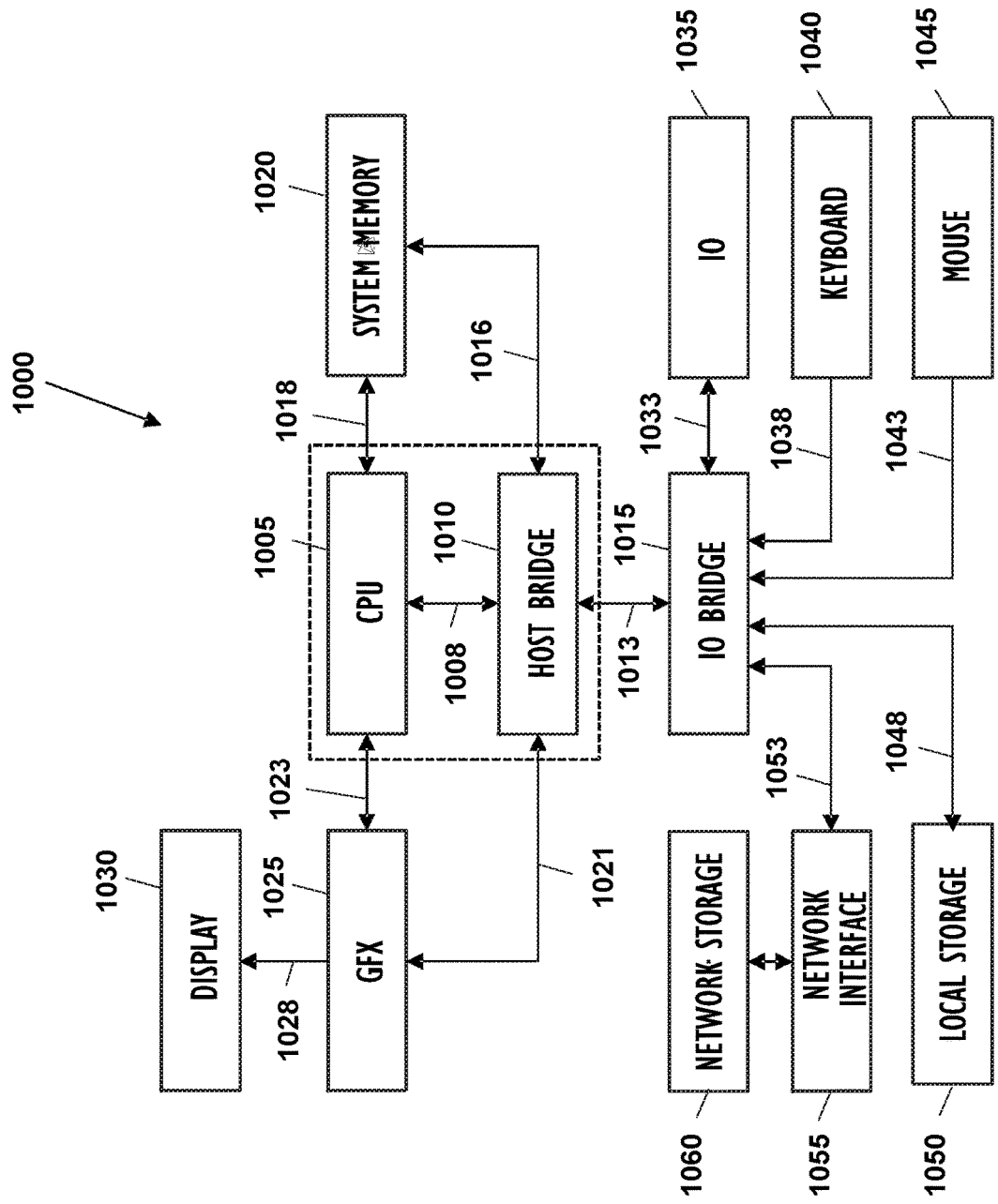
FIG. 12 is a schematic representation of a computer processing device that may be used to implement functions and processes in accordance with one or more examples of the present disclosure.

FIG. 12 is a schematic representation of a computer processing device 1000 that may be used to implement functions and processes in accordance with one or more examples of the present disclosure. FIG. 12 illustrates a computer processing device 1000 that may be used to implement the systems, methods, and processes of this disclosure. For example, computer processing device 1000 illustrated in FIG. 12 could represent a client device or a physical server device and include either hardware or virtual processor(s) depending on the level of abstraction of the computing device. In some instances (without abstraction), computer processing device 1000 and its elements, as shown in FIG. 12, each relate to physical hardware. Alternatively, in some instances one, more, or all of the elements could be implemented using emulators or virtual machines as levels of abstraction. In any case, no matter how many levels of abstraction away from the physical hardware, computer processing device 1000 at its lowest level may be implemented on physical hardware. In one implementation, computer processing device 1000 may allow a subscriber to remotely access one or more data centers. Similarly, the management tool used by the subscriber may include a software solution that runs on such a computer processing device 1000.

FIG. 12 shows a computer processing device 1000 in accordance with one or more examples of the present disclosure. Computer processing device 1000 may be used to implement aspects of the present disclosure, such as aspects associated with the tuning module, the matching network, or other components of a radio frequency plasma processing device. Computer processing device 1000 may include one or more central processing units (singular "CPU" or plural "CPUs") 1005 disposed on one or more printed circuit boards (not otherwise shown). Computer processing device 1000 may further include any type of processing device or programmable logic controller known in the ark. Computer processing device 1000 may also perform the functions of a controller, as a processor, and be used according to the methods and systems described in this disclosure. As such, computer processing device 1000 may be a controller, processor, perform the functions of the controller and/or processor, and may be used to determine capacitor positions within a matching network.

Each of the one or more CPUs 1005 may be a single-core processor (not independently illustrated) or a multi-core processor (not independently illustrated). Multi-core processors typically include a plurality of processor cores (not shown) disposed on the same physical die (not shown) or a plurality of processor cores (not shown) disposed on multiple die (not shown) that are collectively disposed within the same mechanical package (not shown). Computer processing device 1000 may include one or more core logic devices such as, for example, host bridge 1010 and input/output ("10") bridge 1015.

CPU 1005 may include an interface 1008 to host bridge 1010, an interface 1018 to system memory 1020, and an interface 1023 to one or more 10 devices, such as, for example, graphics processing unit ("GFX") 1025. GFX 1025 may include one or more graphics processor cores (not independently shown) and an interface 1028 to display 1030. In certain embodiments, CPU 1005 may integrate the functionality of GFX 1025 and interface directly (not shown) with display 1030. Host bridge 1010 may include an interface 1008 to CPU 1005, an interface 1013 to 10 bridge 1015, for embodiments where CPU 1005 does not include interface 1018 to system memory 1020, an interface 1016 to system memory 1020, and for embodiments where CPU 1005 does not include integrated GFX 1025 or interface 1023 to GFX 1025, an interface 1021 to GFX 1025.

One of ordinary skill in the art will recognize that CPU 1005 and host bridge 1010 may be integrated, in whole or in part, to reduce chip count, motherboard footprint, thermal design power, and power consumption. 10 bridge 1015 may include an interface 1013 to host bridge 1010, one or more interfaces 1033 to one or more 10 expansion devices 1035, an interface 1038 to keyboard 1040, an interface 1043 to mouse 1045, an interface 1048 to one or more local storage devices 1050, and an interface 1053 to one or more network interface devices 1055.

Each local storage device 1050 may be a solid-state memory device, a solid-state memory device array, a hard disk drive, a hard disk drive array, or any other non-transitory computer readable medium. Each network interface device 1055 may provide one or more network interfaces including, for example, Ethernet, Fibre Channel, WiMAX, Wi-Fi, Bluetooth, EtherCAT, Device Net, Mod Bus, RS-232, or any other network protocol suitable to facilitate networked communications. Computer processing device 1000 may include one or more network-attached storage devices 1060 in addition to, or instead of, one or more local storage devices 1050. Network-attached storage device 1060 may be a solid-state memory device, a solid-state memory device array, a hard disk drive, a hard disk drive array, or any other non-transitory computer readable medium. Network-attached storage device 1060 may or may not be collocated with computer processing device 1000 and may be accessible to computer processing device 1000 via one or more network interfaces provided by one or more network interface devices 1055.

One of ordinary skill in the art will recognize that computer processing device 1000 may include alternatives types of processors, such as one or more application specific integrated circuits ("ASICs") that are configured to perform a certain function, such as, for example, hashing (not shown), in a more efficient manner. The one or more ASICs may interface directly with an interface of CPU 1005, host bridge 1010, or IO bridge 1015. Alternatively, an application-specific computing device (not shown), sometimes referred to as mining systems, may be reduced to only those components necessary to perform the desired function, such as hashing via one or more hashing ASICs, to reduce chip count, motherboard footprint, thermal design power, and power consumption. As such, one of ordinary skill in the art will recognize that the one or more CPUs 1005, host bridge 1010, 10 bridge 1015, or ASICs or various sub-sets, supersets, or combinations of functions or features thereof, may be integrated, in whole or in part, or distributed among various devices in a way that may vary based on an application, design, or form factor in accordance with one or more example embodiments. As such, the description of computer processing device 1000 is merely exemplary and not intended to limit the type, kind, or configuration of components that constitute a computing device suitable for performing computing operations, including, but not limited to, hashing functions. Additionally, one of ordinary skill in the art will recognize that computing device 1700, an application specific computing device (not shown), or combination thereof, may be disposed in a standalone, desktop, server, or rack mountable form factor.

One of ordinary skill in the art will recognize that computing device 1000 may be a cloud-based server, a server, a workstation, a desktop, a laptop, a netbook, a tablet, a smartphone, a mobile device, and/or any other type of computing device in accordance with one or more example embodiments.

The controllers described above are computing devices that store and execute non-transient computer-executable instructions to perform the control functions described in this disclosure. Each computing devices in the various embodiments generally include general or special purpose computer components including user input/output ("I/O") devices, wired and wireless communication hardware and software, local area and wide area network connection hardware and software, one or more processors, one or more computer readable storage media storing non-transitory computer-executable instructions that, when executed by the processor, causes the controller to perform operations described in the flow charts and elsewhere in this disclosure. The processor may be, for example, a central processing unit ("CPU"), sometimes referred to as a controller, microcontroller, processor or similar designation, together with other motherboard, computer bus, random access memory, solid state or other non-volatile memory, peripheral device drivers, and interface components typically included in general purpose, specially programmed user devices, network devices, and computing platforms. For example, each controller described as part of the various embodiments may be a computing device commonly referred to as an erasable programmable read only memory ("EEPROM"), a programmable logic controller ("PLC"), a field programmable gate array ("FPGA"), an application-specific integrated circuit ("ASIC"), a microcontroller, a relay controller, a general purpose computer, a cloud computer platform, or any other suitable computing device as deemed appropriate or convenient for the computing task at hand.

The executable instructions are stored in the controller as may be the programmable parameters on some kind of machine-readable storage medium. A machine-readable storage medium may include both volatile and nonvolatile, removable and non-removable media, and may be any electronic, magnetic, optical, or other physical storage device that contains or stores executable instructions, data structures, program module, or other data accessible to a processor, for example firmware, erasable programmable read-only memory ("EPROM"), random access memory ("RAM"), non-volatile random access memory ("NVRAM"), optical disk, solid state drive ("SSD"), flash memory chips, and the like. The machine-readable storage medium may be a non-transitory storage medium, where the term "non-transitory" does not encompass transitory propagating signals.

Those skilled in the art will recognize that it is common within the art to describe devices and/or processes in the fashion set forth in this disclosure, and then use engineering practices to integrate such described devices and/or processes into data processing systems. That is, at least a portion of the devices and/or processes described can be integrated into a data processing system via a reasonable amount of experimentation. Those having skill in the art will recognize that a typical data processing system generally includes one or more of a system unit housing, a video display device, a memory such as volatile and non-volatile memory, processors such as microprocessors and digital signal processors, computational entities such as operating systems, drivers, graphical user interfaces, and applications programs, one or more interaction devices, such as a touch pad or screen, and/or control systems including feedback loops and control motors (e.g., feedback for sensing position and/or velocity; control motors for moving and/or adjusting components and/or quantities).

A typical data processing system may be implemented utilizing any suitable commercially available components, such as those typically found in data computing and/or communication and/or network computing/communication systems. All of the technology described in this disclosure is suitable for implementation using commercially available computing devices, such as network servers and smartphones or personal computers. These computing devices may be interconnected via the Internet, mobile telephone voice and data system, or other data suitable network.

This disclosure sometimes illustrates different components contained within, or connected with, different other components. It is to be understood that such depicted architectures are merely exemplary, and that in fact many other architectures can be implemented which achieve the same functionality. In a conceptual sense, any arrangement of components to achieve the same functionality is effectively "associated" such that the desired functionality is achieved. Hence, any two components may be combined to achieve a particular functionality can be seen as "associated with" each other such that the desired functionality is achieved, irrespective of architectures or intermediate components. Likewise, any two components so associated can also be viewed as being "connected," or "coupled," to each other to achieve the desired functionality, and any two components capable of being so associated can also be viewed as being "functionally connected" to each other to achieve the desired functionality. Specific examples of functional connection include but are not limited to physical connections and/or physically interacting components and/or wirelessly communicating and/or wirelessly interacting components and/or logically interacting and/or logically interacting components.

It will be appreciated that layers, features, elements, etc., depicted herein are illustrated with particular dimensions relative to one another, such as structural dimensions or orientations, for example, for purposes of simplicity and ease of understanding and that actual dimensions of the same differ substantially from that illustrated herein, in some embodiments. Moreover, "exemplary" is used herein to mean serving as an example, instance, illustration, etc., and not necessarily as advantageous. As used in this application, "or" is intended to mean an inclusive "or" rather than an exclusive "or." In addition, "a" and "an" as used in this application and the appended claims are generally be construed to mean "one or more" unless specified otherwise or clear from context to be directed to a singular form. Also, at least one of A and B and/or the like generally means A or B or both A and B. Furthermore, to the extent that "includes," "having," "has," "with," or variants thereof are used, such terms are intended to be inclusive in a manner similar to the term "comprising." Also, unless specified otherwise, "first," "second," or the like are not intended to imply a temporal aspect, a spatial aspect, an ordering, etc. Rather, such terms are merely used as identifiers, names, etc. for features, elements, items, etc. For example, a first element and a second element generally correspond to element A and element B or two different or two identical elements or the same element.

While particular aspects of the present subject matter have been shown and described in detail, it will be apparent to those skilled in the art that, based upon the teachings of this disclosure, changes and modifications may be made without departing from the subject matter described in this disclosure and its broader aspects and, therefore, the appended claims are to encompass within their scope all such changes and modifications as are within the true spirit and scope of the subject matter described in this disclosure. Although particular embodiments of this disclosure have been illustrated, it is apparent that various modifications and embodiments of the disclosure may be made by those skilled in the art without departing from the scope and spirit of the disclosure. Accordingly, the scope of the disclosure should be limited only by the claims appended hereto.

The invention claimed is:

1. A motorless power electronic test device for selectively conducting variable-power, variable-frequency testing of an external power converter and an external rectifier without loading a motor with the test device when conducting the testing, comprising:
- a bidirectional internal power converter comprising a DC link and an AC link;
- a filter comprising an input and an output;
- a plurality of line switches for setting test modes and operating the test device;
- a switch controller for operating the line switches to separately test the external power converter or the external rectifier, the bidirectional internal power converter operating in an AC-to-DC mode for testing the external power converter and operating in a DC-to-AC mode for testing the external rectifier;
- wherein, when the line switches are set to test the external power converter, the DC link of the bidirectional internal power converter is coupled to a DC link of the external power converter to recycle test power to mitigate electric losses during the variable-power, variable-frequency testing of the external power converter;
- wherein, when the line switches are set to test the external rectifier, the output of the filter is coupled to an input of the external rectifier to recycle test power to mitigate electric losses during the variable-power, variable-frequency testing of the external rectifier.

2. The motorless power electronic test device of claim 1, wherein the filter comprises an isolation transformer.

3. The motorless power electronic test device of claim 2, wherein:
- the filter comprises a series connected magnetic core inductor and a shunt capacitor for each of three phases electric phase;
- outputs of the shunt capacitors are connected together forming a 3-phase neutral.

4. The motorless power electronic test device of claim 3, further comprising a ground switch for selectively coupling the 3-phase neutral to electric ground.

5. The motorless power electronic test device of claim 4, further comprising a resistor switch for selectively coupling the 3-phase neutral to electric ground through a current-limiting resistor.

6. The motorless power electronic test device of claim 1, wherein the filter further comprises, for each of three electric phases:
- a resistor and a magnetic core inductor connected in series between the external power converter and the internal power converter; and
- a shunt leg comprising a resistor and a capacitor connected in series;
- wherein the output of the shunt legs are connected to each other forming a 3-phase neutral.

7. The motorless power electronic test device of claim 1, wherein the filter further comprises a tri-core reactor.

8. A motorless power electronic test device for conducting variable-power, variable-frequency testing of an external power converter without loading a motor with the test device an internal power converter when conducting the testing, comprising a DC link and an AC link;
- a filter comprising an input and an output;
- a rectifier comprising an input and an output;
- wherein the DC link of the internal power converter is coupled to a DC link of the external power converter to recycle test power to mitigate electric losses during the variable-power, variable-frequency testing of the external power converter.

9. The motorless power electronic test device of claim 8, wherein the filter comprises an isolation transformer.

10. The motorless power electronic test device of claim 9, wherein:
- the filter further comprises a series connected magnetic core inductor and a shunt capacitor for each of three phases electric phase; and
- outputs of the shunt capacitors are connected together forming a 3-phase neutral.

11. The motorless power electronic test device of claim 10, further comprising a ground switch for selectively coupling the 3-phase neutral to electric ground.

12. The motorless power electronic test device of claim 11, further comprising a resistor switch for selectively coupling the 3-phase neutral to electric ground through a current-limiting resistor.

13. The motorless power electronic test device of claim 8, wherein the filter further comprises, for each of three electric phases:
- a resistor and a magnetic core inductor connected in series between the external power converter and the internal power converter; and
- a shunt leg comprising a resistor and a capacitor connected in series, with outputs connected to each other forming a 3-phase neutral.

14. The motorless power electronic test device of claim 8, wherein the filter further comprises a tri-core reactor.

15. A motorless power electronic test device for conducting variable-power, variable-frequency testing of an external rectifier without loading a motor with the test device when conducting the full-power testing, comprising:
- a power converter comprising a DC link and an AC link;
- a filter comprising an input and an output;
- the external rectifier comprising an input coupled to an AC power source and an output coupled to the DC link of the power converter;
- the AC link of the power converter coupled to the input of the filter;
- the output of the filter coupled to the input of the external rectifier to recycle test power to mitigate electric losses during the variable-power, variable-frequency testing of the external rectifier.

16. The motorless power electronic test device of claim 15, wherein the filter comprises an isolation transformer.

17. The motorless power electronic test device of claim 15, wherein:
- the filter further comprises a series connected magnetic core inductor and a shunt capacitor for each of three phases electric phase; and
- outputs of the shunt capacitors are connected together forming a 3-phase neutral.

18. The motorless power electronic test device of claim 17, further comprising a ground switch for selectively coupling the 3-phase neutral to electric ground, or a resistor switch for selectively coupling the 3-phase neutral to electric ground through a current-limiting resistor.

19. The motorless power electronic test device of claim 15, wherein the filter further comprises, for each of three electric phases:
- a resistor and a magnetic core inductor connected in series between the external power converter and the internal power converter; and
- a shunt leg comprising a resistor and a capacitor connected in series, with outputs connected to each other forming a 3-phase neutral.

20. The motorless power electronic test device of claim 15, wherein the filter further comprises a tri-core reactor.

* * * * *